United States Patent [19]

Zheng et al.

[11] Patent Number: 5,728,621
[45] Date of Patent: Mar. 17, 1998

[54] METHOD FOR SHALLOW TRENCH ISOLATION

[75] Inventors: Jia Zhen Zheng, Singapore, Singapore; Charlie Wee Song Tay, Johor, Malaysia; Wei Lu, Singapore, Singapore; Lap Chan, San Francisco, Calif.

[73] Assignee: Chartered Semiconductor Manufacturing PTE Ltd, Singapore, Singapore

[21] Appl. No.: 845,870

[22] Filed: Apr. 28, 1997

[51] Int. Cl.$^6$ ................................ H01L 21/76
[52] U.S. Cl. ............... 438/427; 438/424; 438/296; 438/221
[58] Field of Search ................... 438/424, 427, 438/435, 359, 296, 221

[56] References Cited

U.S. PATENT DOCUMENTS

| | | | |
|---|---|---|---|
| 4,842,675 | 6/1989 | Chapman et al. | 156/643 |
| 5,182,221 | 1/1993 | Sato | 438/424 |
| 5,242,853 | 9/1993 | Sato et al. | 438/427 |
| 5,244,827 | 9/1993 | Dixit et al. | 438/431 |
| 5,312,512 | 5/1994 | Allman et al. | 156/636 |
| 5,494,854 | 2/1996 | Jain | 437/195 |
| 5,498,565 | 3/1996 | Gocho et al. | 438/427 |

FOREIGN PATENT DOCUMENTS 218192  8/1993  Japan .

*Primary Examiner*—Trung Dang
*Attorney, Agent, or Firm*—George O. Saile; Stephen B. Ackerman; Rosemary L. S. Pike

[57] ABSTRACT

A new method for forming planarized high quality oxide shallow trench isolation is described. A nitride layer overlying a pad oxide layer is provided over the surface of a semiconductor substrate. A plurality of isolation trenches is etched through the nitride and pad oxide layers into the semiconductor substrate wherein there is at least one first wide nitride region between two of the isolation trenches and at least one second narrow nitride region between another two of the isolation trenches. A high density plasma (HDP) oxide layer is deposited over the nitride layer filling the isolation trenches wherein the HDP oxide deposits more thickly in the first region over the wide nitride layer and deposits more thinly in the second region over the narrow nitride layer and wherein the difference in step heights of the HDP oxide between the first region and a region overlying an isolation trench is a first height. A layer of spin-on-glass is coated over the HDP oxide layer wherein the difference in step heights of the spin-on-glass material between the first region and the region overlying an isolation trench is a second height smaller than the first height. The spin-on-glass layer and portions of the HDP oxide layer in the first region are etched away. The spin-on-glass layer and HDP oxide layer remaining are polished away wherein the substrate is planarized.

21 Claims, 5 Drawing Sheets

METHOD FOR SHALLOW TRENCH ISOLATION

BACKGROUND OF THE INVENTION

(1) Field of the Invention

The present invention relates to the fabrication of integrated circuit devices, and more particularly, to a method of forming high quality oxide shallow trench isolation in the fabrication of integrated circuits.

(2) Description of the Prior Art

Shallow trench isolation (STI) is gaining substantial interest in integrated circuit manufacturing. Most STI uses ozone-TEOS (tetraethoxysilane) for gap-filling, then resist etchback and chemical mechanical polishing (CMP) for planarization.

The conventional approach using ozone-TEOS for gap-filling has the problem of not completely filling the trenches. Keyholes or weak seams form in the center of the trenches. The oxide quality is also relatively poor compared with thermally grown oxide. Another problem is the oxide dishing during CMP which will expose narrow isolated active regions.

Spin-on-glass has also been used for trench fill as in U.S. Pat. No. 5,312,512 to Allman et al. However, spin-on-glass cannot be used for shallow trench isolation. The spin-on-glass cannot be left inside the trench for isolation because of its properties; i.e., its high moisture absorption and intolerance for the high temperature annealing processing required for fabrication of transistors.

Some workers have begun to use high density plasma (HDP) oxide for gap filling. HDP oxide is a more stable film than ozone-TEOS and can fill a narrow trench without any weak spots. U.S. Pat. No. 5,494,854 to Jain uses HDP oxide to fill gaps, followed by depositing a TEOS or doped oxide which is then planarized by CMP. However, this patent is for the inter-metal dielectric application.

SUMMARY OF THE INVENTION

Accordingly, the primary object of the invention is to provide a process for forming planarized shallow trench isolation in the fabrication of integrated circuits.

A further object of the invention is to provide a process for forming high quality oxide shallow trench isolation.

Yet another object is to reduce dishing in wide trenches in forming shallow trench isolation.

Yet another object is to prevent the exposure of narrow isolated active regions in forming shallow trench isolation.

In accordance with the objects of the invention, a method for forming planarized high quality oxide shallow trench isolation is achieved. A pad oxide layer is provided over the surface of a semiconductor substrate. A nitride layer is deposited overlying the pad oxide layer. A plurality of isolation trenches is etched through the nitride and pad oxide layers into the semiconductor substrate wherein there is at least one first wide nitride region between two of the isolation trenches and at least one second narrow nitride region between another two of the isolation trenches. A high density plasma oxide layer is deposited over the nitride layer and within the isolation trenches wherein the high density plasma oxide layer fills the isolation trenches and wherein the high density plasma oxide deposits more thickly in the first region over the wide nitride layer and deposits more thinly in the second region over the narrow nitride layer and wherein the difference in step heights of the high density plasma oxide between the first region and a region overlying an isolation trench is a first height. A layer of spin-on-glass is coated over the high density plasma oxide layer wherein the difference in step heights of the spin-on-glass material between the first region and the region overlying an isolation trench is a second height smaller than the first height. The spin-on-glass layer and portions of the high density plasma oxide layer in the first region are etched away. The spin-on-glass layer and high density plasma oxide layer remaining are polished away wherein the substrate is planarized. The fabrication of integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
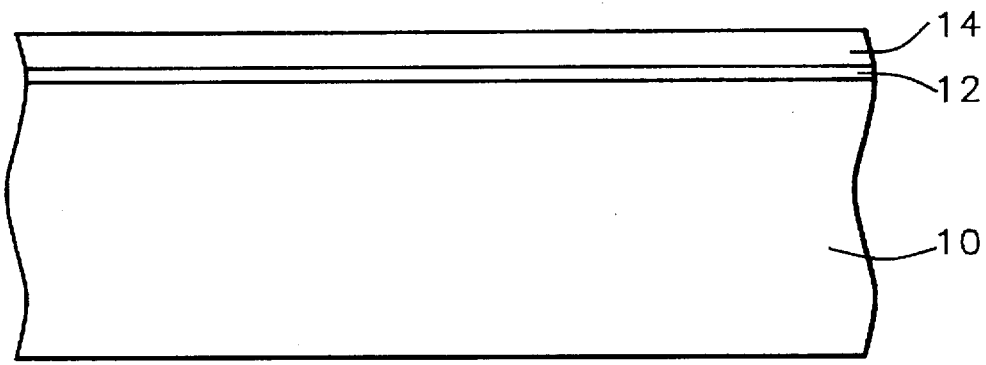
FIGS. 1 through 9 are cross-sectional representations of a preferred embodiment of the present invention.

Referring now more particularly to FIG. 1, there is shown a semiconductor substrate 10. A layer of pad silicon oxide 12 is grown on the surface of the semiconductor substrate to a thickness of between about 50 and 300 Angstroms. A layer of silicon nitride 14 is deposited over the pad oxide layer 12 to a thickness of between about 500 and 2000 Angstroms. The silicon nitride thickness is less than the conventional thickness of between about 1500 and 3000 Angstroms. The use of spin-on-glass for planarization in the process of the invention allows for a thinner silicon nitride layer. This will allow for a smaller step height and less variation in the step height, leading to better planarization.

Figure 2:
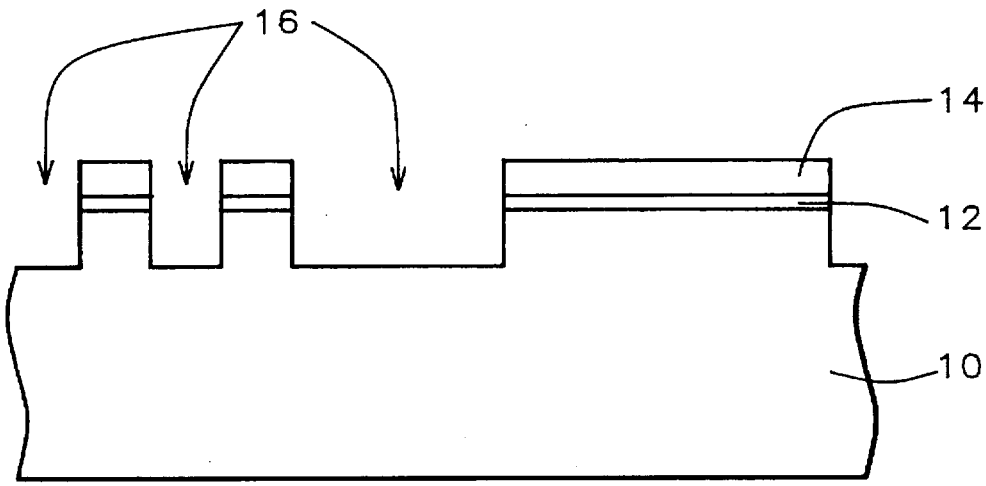

Referring now to FIG. 2, shallow trenches are etched into the silicon Substrate using conventional photolithography and etching techniques. The shallow trenches 16 are etched to a depth of between about 2000 and 6000 Angstroms into the semiconductor substrate.

Figure 3:
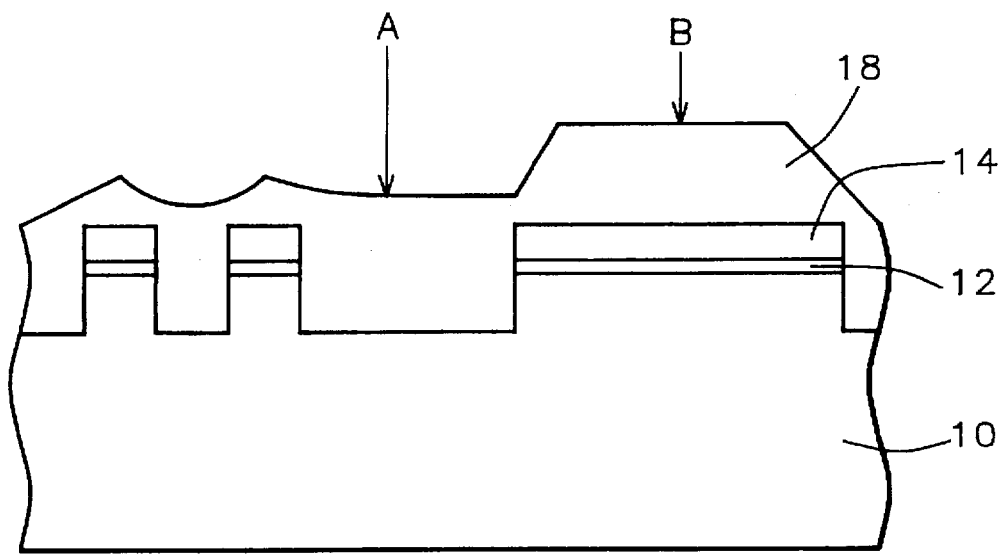

Referring now to FIG. 3, a layer of high density plasma oxide (HDP) 18 is deposited by chemical vapor deposition (CVD) to a thickness of between about 6000 and 10,000 Angstroms over the surface of the substrate and filling the trenches. The HDP oxide is deposited using a $SiH_4$, $O_2$, and Ar chemistry and an inductively coupled plasma source to generate a high density plasma. Ozone-TEOS is poorer in quality than HDP oxide because it is deposited with the strong oxidizer ozone which enhances the reaction. HDP oxide is deposited with $SiH_4$ and $O_2$; the high energy ions will also make the film more dense.

HDP oxide is deposited with simultaneous sputtering of $SiO_2$ at the corner, resulting in a 45° faceted oxide profile. The sputter rate over the narrow areas is greater than the sputter rate over the wide areas. This results in a greater thickness of the HDP oxide over wide areas than over narrow areas.

There is a difference in step height between area A over a trench and area B over a wide silicon nitride area of between about 4000 and 8000 Angstroms, depending upon the trench depth.

Figure 4:
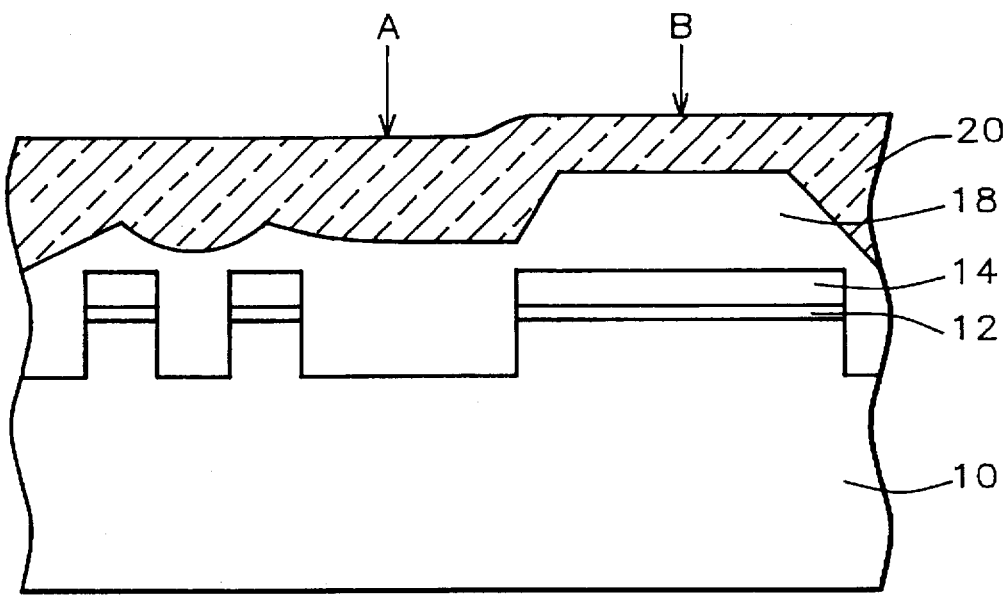

Referring now to FIG. 4, a layer of spin-on-glass 20 is coated over the HDP oxide layer 18. The spin-on-glass material may be a silicate or a siloxane material. The spin-on-glass material suspended in a vehicle or solvent is deposited onto the semiconductor wafer surface and uniformly spread thereover by the action of spinning the wafer. The material fills the indentations in the integrated circuit wafer surface. Most of the vehicle or solvent is driven off by a low temperature baking step.

Optionally, the spin-on-glass can be coated using a rotary cup. By using a rotary cup with cap, the solvent will evaporated much more slowly to allow the spin-on-glass to fill the lower regions better. Hence, the final step height is much reduced.

The spin-on-glass material is deposited to a thickness of between about 4000 and 8000 Angstroms. After deposition of the spin-on-glass layer, the step height difference between A and B has been reduced to between about 1000 and 3000 Angstroms.

Figure 5:
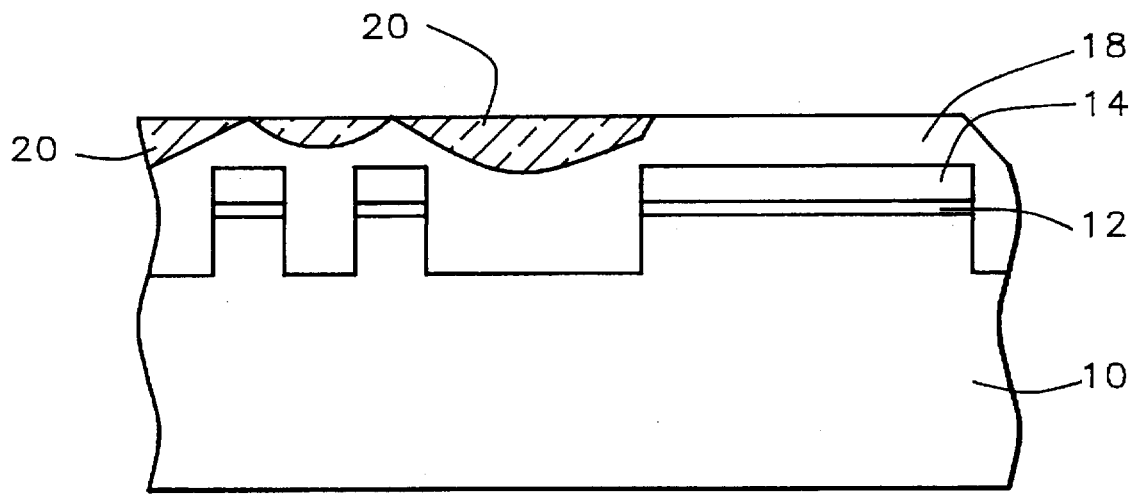

The spin-on-glass and HDP oxide are etched back using a timed etch where the etch selectivity of spin-on-glass to HDP oxide is 1:1. The etchback is timed so that between about 2000 and 3000 Angstroms of HDP oxide is left on the wide silicon nitride areas. FIG. 5 illustrates the wafer after etchback.

Figure 6:
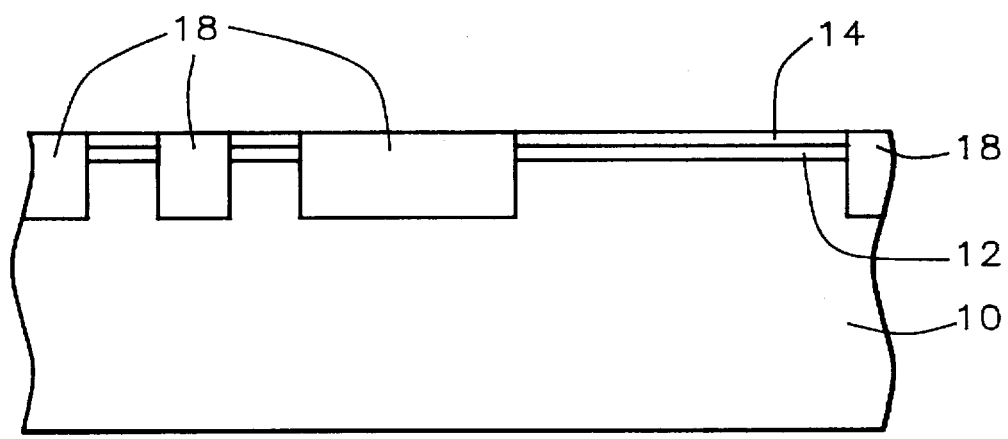

Optionally, the remaining spin-on-glass material and HDP oxide overlying the silicon nitride areas may be polished away using chemical mechanical polishing (CMP) with a polish stop at the silicon nitride layer, resulting in the planarized shallow trench isolation illustrated in FIG. 6.

Figure 7:
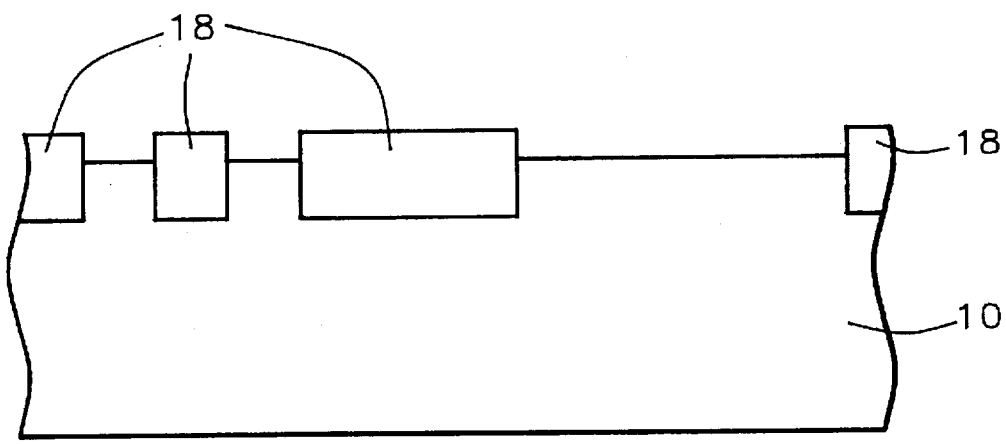
Figure 8:
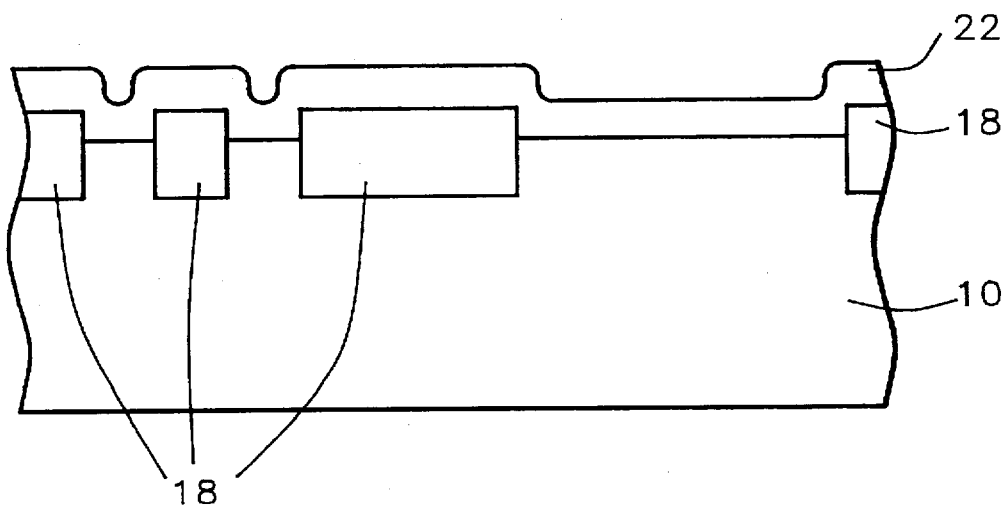

Referring now to FIG. 7, the silicon nitride 14 is etched away and the pad oxide 12 is removed. (This step is optional.) A sacrificial oxide layer 22 is grown over the surface of the substrate, as illustrated in FIG. 8. The thickness of the layer 22 is between about 500 to 3000 Angstroms.

Figure 9:
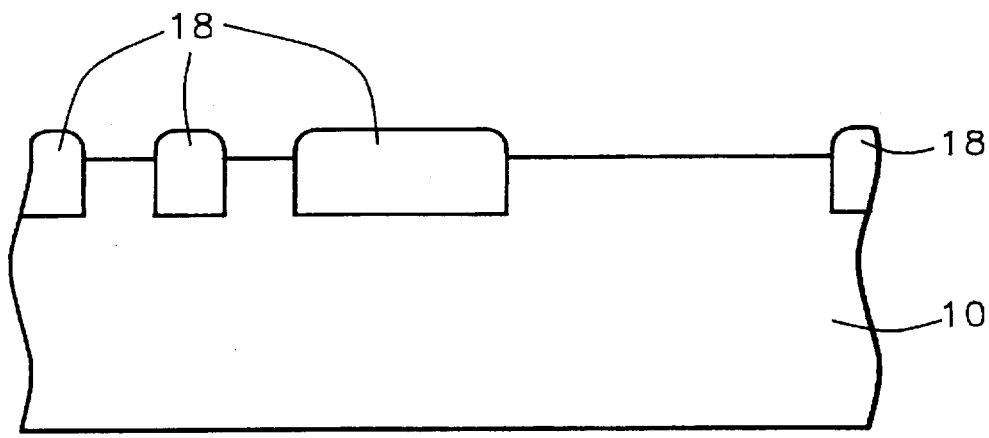

The sacrificial oxide 22 is etched away using an anisotropic plasma etch with some overetch. The anisotropic plasma etch used $CHF_3/CF_4$ gas chemistry. The step height between the active areas 28 and the isolation areas 18 is reduced. The corners of the HDP oxide isolation areas 18 are also etched away and become rounded, as illustrated in FIG. 9. The rounded corners on the isolation areas are required for subsequent polysilicon gate etching. The round active silicon corner will reduce electric field crowding.

Figure 10:
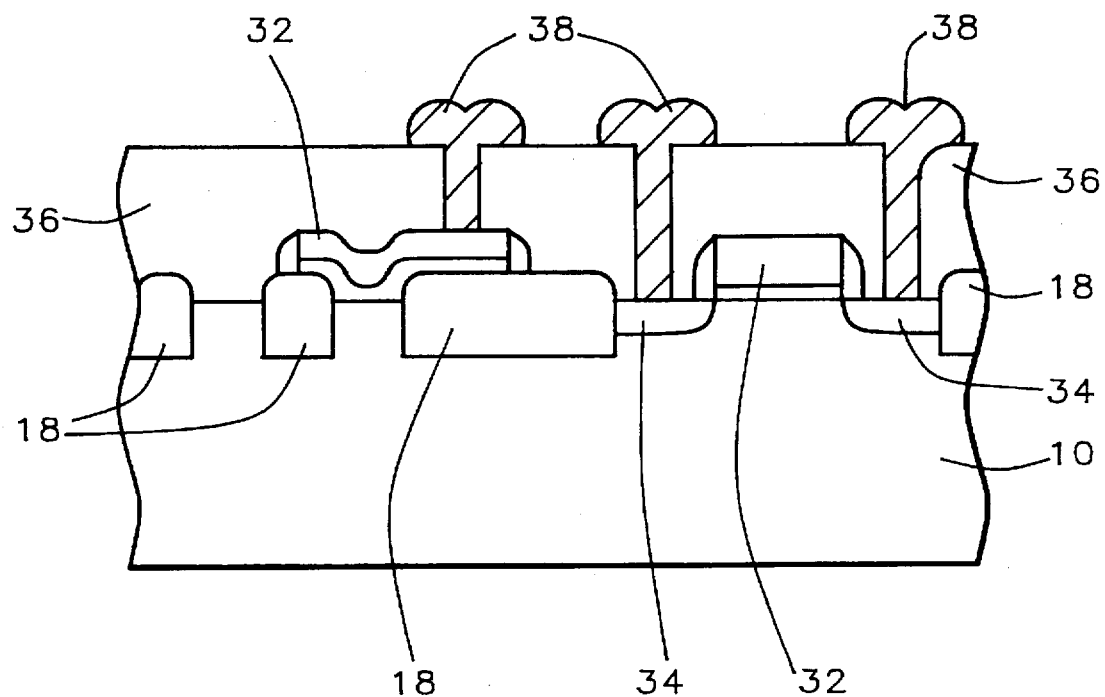
FIG. 10 is a cross-sectional representation of a completed integrated circuit device fabricated by the process of the present invention.

FIG. 10 illustrates a completed integrated circuit device fabricated according to the process of the invention. After the trench isolation areas 18 have been completed, as shown in FIG. 9, gate electrodes 32 and source and drain regions 34 are fabricated in and on the semiconductor substrate. A thick dielectric layer, such as borophosphosilicate glass (BPSG) layer 36, is deposited over the gate electrodes 32. Contact openings are made through the dielectric layer 36 where electrical connections are desired. A conducting layer 38 is deposited to fill the contact openings and patterned to complete the electrical connections in the integrated circuit device, as shown in FIG. 10.

The process of the present invention results in the formation of planarized shallow trench isolation using HDP oxide. HDP oxide is a high quality oxide having a low wet chemical etching rate, better moisture resistance, and fewer problems in subsequent processing steps than the conventional STI material. The use of spin-on-glass material to planarize the surface in forming the trench isolation allows better process control, less dishing, and less of a chance of exposing the narrow active areas during CMP compared to direct CMP of HDP oxide. The spin-on-glass allows for a smaller step height. After spin-on-glass etchback, the amount of oxide to be polished using CMP is less than without spin-on-glass etchback. A thinner silicon nitride layer can be used because less overpolishing is required.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing a pad oxide layer over the surface of a semiconductor substrate;

depositing a nitride layer overlying said pad oxide layer;

etching a plurality of isolation trenches through said nitride and said pad oxide layers into said semiconductor substrate wherein there is at least one first wide nitride region between two of said isolation trenches and at least one second narrow nitride region between another two of said isolation trenches;

depositing a high density plasma oxide layer over said nitride layer and within said isolation trenches wherein said high density plasma oxide layer fills said isolation trenches and wherein said high density plasma oxide deposits more thickly in said first region over said wide nitride layer and deposits more thinly in said second region over said narrow nitride layer and wherein the difference in step heights of said high density plasma oxide between said first region and a third region overlying an isolation trench is a first height;

coating a layer of spin-on-glass over said high density plasma oxide layer wherein the difference in step heights of said spin-on-glass material between said first region and said third region is a second height smaller than said first height;

etching back said spin-on-glass layer and said portions of said high density plasma oxide layer in said first region;

polishing away said spin-on-glass layer and said high density plasma oxide layer remaining wherein said substrate is planarized; and completing the fabrication of said integrated circuit device.

2. The method according to claim 1 wherein said silicon nitride layer has a thickness of between about 500 and 2000 Angstroms.

3. The method according to claim 1 wherein said high density plasma oxide layer is deposited to a thickness of between about 6000 and 10,000 Angstroms.

4. The method according to claim 1 wherein said first height is between about 4000 and 8000 Angstroms.

5. The method according to claim 1 wherein said spin-on-glass layer is coated to a thickness of between about 4000 and 8000 Angstroms.

6. The method according to claim 1 wherein said second height is between about 1000 and 3000 Angstroms.

7. The method according to claim 1 wherein said etching back is performed with an etch selectivity of spin-on-glass to high density plasma oxide of 1:1.

8. The method according to claim 1 wherein said polishing is done by chemical mechanical polishing.

9. The method according to claim 1 wherein said completing fabrication of said integrated circuit device comprises:

etching away said silicon nitride layer;

removing said pad oxide layer whereby said trench isolation areas extend above the surface of said semiconductor substrate wherein said trench isolation areas above said surface of said semiconductor substrate have sharp corners;

depositing a sacrificial oxide layer overlying said isolation trenches and said semiconductor substrate;

etching away said sacrificial oxide layer whereby said sharp corners of said trench isolation areas are etched away and wherein said trench isolation areas above said surface of said semiconductor substrate now have rounded corners; and fabricating semiconductor device structures in and on said semiconductor substrate between said isolation trenches.

10. The method according to claim 9 wherein said semiconductor device structures include gate electrodes and source and drain regions and electrical connections between said gate electrodes and said source and drain regions.

11. A method of manufacturing an integrated circuit device comprising:

providing a pad oxide layer over the surface of a semiconductor substrate;

depositing a nitride layer overlying said pad oxide layer;

etching a plurality of isolation trenches through said nitride and said pad oxide layers into said semiconductor substrate wherein there is at least one first wide nitride region between two of said isolation trenches and at least one second narrow nitride region between another two of said isolation trenches;

depositing a high density plasma oxide layer over said nitride layer and within said isolation trenches wherein said high density plasma oxide layer fills said isolation trenches and wherein said high density plasma oxide deposits more thickly in said first region over said wide nitride layer and deposits more thinly in said second region over said narrow nitride layer and wherein the difference in step heights of said high density plasma oxide between said first region and a third region overlying an isolation trench is a first height;

coating a layer of spin-on-glass over said high density plasma oxide layer wherein the difference in step heights of said spin-on-glass material between said first region and said third region is a second height smaller than said first height;

etching back said spin-on-glass layer and said portions of said high density plasma oxide layer in said first region;

polishing away said spin-on-glass layer and said high density plasma oxide layer remaining wherein said substrate is planarized;

etching away said silicon nitride layer;

removing said pad oxide layer whereby said trench isolation areas extend above the surface of said semiconductor substrate wherein said trench isolation areas above said surface of said semiconductor substrate have sharp corners;

depositing a sacrificial oxide layer overlying said isolation trenches and said semiconductor substrate;

etching away said sacrificial oxide layer whereby said sharp corners of said trench isolation areas are etched away and wherein said trench isolation areas above said surface of said semiconductor substrate now have rounded corners; and fabricating semiconductor device structures in and on said semiconductor substrate between said isolation trenches.

12. The method according to claim 11 wherein said silicon nitride layer has a thickness of between about 500 and 2000 Angstroms.

13. The method according to claim 11 wherein said high density plasma oxide layer is deposited to a thickness of between about 6000 and 10,000 Angstroms.

14. The method according to claim 11 wherein said first height is between about 4000 and 8000 Angstroms.

15. The method according to claim 11 wherein said spin-on-glass layer is coated to a thickness of between about 4000 and 8000 Angstroms.

16. The method according to claim 11 wherein said second height is between about 1000 and 3000 Angstroms.

17. The method according to claim 11 wherein said etching back is performed with an etch selectivity of spin-on-glass to high density plasma oxide of 1:1.

18. The method according to claim 11 wherein said polishing is done by chemical mechanical polishing.

19. The method according to claim 11 wherein said semiconductor device structures include gate electrodes and source and drain regions and electrical connections between said gate electrodes and said source and drain regions.

20. A method of forming shallow trench isolation in the fabrication of an integrated circuit device comprising:

providing a pad oxide layer over the surface of a semiconductor substrate;

depositing a nitride layer overlying said pad oxide layer;

etching a plurality of isolation trenches through said nitride and said pad oxide layers into said semiconductor substrate wherein there is at least one first wide nitride region between two of said isolation trenches and at least one second narrow nitride region between another two of said isolation trenches;

depositing a high density plasma oxide layer over said nitride layer and within said isolation trenches wherein said high density plasma oxide layer fills said isolation trenches and wherein said high density plasma oxide deposits more thickly in said first region over said wide nitride layer and deposits more thinly in said second region over said narrow nitride layer and wherein the difference in step heights of said high density plasma oxide between said first region and a third region overlying an isolation trench is a first height;

coating a layer of spin-on-glass over said high density plasma oxide layer wherein the difference in step heights of said spin-on-glass material between said first region and said third region is a second height smaller than said first height; and etching back said spin-on-glass layer and said portions of said high density plasma oxide layer in said first region completing the formation of said shallow trench isolation in the fabrication of said integrated circuit device.

21. The method according to claim 20 further comprising:

polishing away said spin-on-glass layer and said high density plasma oxide layer remaining wherein said substrate is planarized;

etching away said silicon nitride layer;

removing said pad oxide layer whereby said trench isolation areas extend above the surface of said semiconductor substrate wherein said trench isolation areas above said surface of said semiconductor substrate have sharp corners;

depositing a sacrificial oxide layer overlying said isolation trenches and said semiconductor substrate; and etching away said sacrificial oxide layer whereby said sharp corners of said trench isolation areas are etched away and wherein said trench isolation areas above said surface of said semiconductor substrate now have rounded corners.

* * * * *